US011965950B2

United States Patent
Li et al.

(10) Patent No.: US 11,965,950 B2
(45) Date of Patent: Apr. 23, 2024

(54) SLICE ORDERING FOR MB-EPI ASL IMAGING

(71) Applicants: Siemens Healthineers AG, Forchheim (DE); Regents of the University of Minnesota, Minneapolis, MN (US)

(72) Inventors: Xiufeng Li, Shoreview, MN (US); Gregory J. Metzger, Lake Elmo, MN (US); Essa Yacoub, Hudson, WI (US); Kamil Ugurbil, Minneapolis, MN (US); Dingxin Wang, Apple Valley, MN (US)

(73) Assignees: Siemens Healthineers AG, Forchheim (DE); Regents of the University of Minnesota, Minneapolis, MN (US)

( * ) Notice: Subject to any disclaimer, the term of this patent is extended or adjusted under 35 U.S.C. 154(b) by 301 days.

(21) Appl. No.: 16/524,254

(22) Filed: Jul. 29, 2019

(65) Prior Publication Data
US 2020/0341099 A1   Oct. 29, 2020

Related U.S. Application Data

(60) Provisional application No. 62/837,784, filed on Apr. 24, 2019.

(51) Int. Cl.
*G01R 33/563* (2006.01)
*G01R 33/483* (2006.01)
*G01R 33/561* (2006.01)

(52) U.S. Cl.
CPC ... *G01R 33/56366* (2013.01); *G01R 33/4835* (2013.01); *G01R 33/5611* (2013.01); *G01R 33/5616* (2013.01)

(58) Field of Classification Search
CPC .......... G01R 33/56366; G01R 33/4835; G01R 33/5611; G01R 33/5616
See application file for complete search history.

(56) References Cited

U.S. PATENT DOCUMENTS

| | | | |
|---|---|---|---|
| 2003/0002631 A1* | 1/2003 | Gaddipati | G06F 8/34 378/210 |
| 2009/0302840 A1* | 12/2009 | Fung | G01R 33/5601 324/309 |

(Continued)

OTHER PUBLICATIONS

Howseman, A., et al., "The Effect of Slice Order and Thickness on fMRI Activation Data Using Multislice Echo-Planar Imaging," Journal of Neuroimaging. vol. 9, 1999. p. 363-376 (Year: 1999).*

(Continued)

*Primary Examiner* — Keith M Raymond
*Assistant Examiner* — Sean A Frith

(57) ABSTRACT

A method for generating a perfusion weighted image using arterial spin labeling (ASL) with segmented acquisitions includes dividing an anatomical area of interest into a plurality of slices and performing a multi-band (MB) echo planar imaging (EPI) acquisition process using a magnetic resonance imaging (MRI) system to acquire a control image dataset representative of the plurality of slices using a central-to-peripheral or peripheral-to-central slice acquisition order. An ASL preparation process is performed using the MRI system to magnetically label protons in arterial blood water in an area upstream from the anatomical area of interest. Following a post-labeling delay time period, the MB EPI acquisition process is performed to a labeled image dataset corresponding to the slices using the central-to-peripheral or peripheral-to-central slice acquisition order. A perfusion weighted image of the anatomical area is generated by subtracting the labeled image dataset from the control image dataset.

10 Claims, 7 Drawing Sheets

| ASC | C2POF | C2PEF | P2COF | P2CEF |
|---|---|---|---|---|
| 10 | 10 | 9 | 2 | 1 |
| 9 | 8 | 7 | 4 | 3 |
| 8 | 6 | 5 | 6 | 5 |
| 7 | 4 | 3 | 8 | 7 |
| 6 | 2 | 1 | 10 | 9 |
| 5 | 1 | 2 | 9 | 10 |
| 4 | 3 | 4 | 7 | 8 |
| 3 | 5 | 6 | 5 | 6 |
| 2 | 7 | 8 | 3 | 4 |
| 1 | 9 | 10 | 1 | 2 |

(56) References Cited

U.S. PATENT DOCUMENTS

| | | | | |
|---|---|---|---|---|
| 2013/0200892 A1* | 8/2013 | Hargreaves | ........ | G01R 33/4835 |
| | | | | 324/309 |
| 2016/0077180 A1* | 3/2016 | Beck | ................ | G01R 33/56509 |
| | | | | 324/309 |
| 2016/0203603 A1* | 7/2016 | Li | .................... | G01R 33/56366 |
| | | | | 382/131 |
| 2017/0082718 A1* | 3/2017 | Beck | .................. | G01R 33/4818 |
| 2018/0049665 A1* | 2/2018 | Jeong | .................... | A61B 5/055 |
| 2018/0128891 A1* | 5/2018 | Jeong | ................ | G01R 33/5602 |

OTHER PUBLICATIONS

Jeong, E., et al., "High-Resolution Diffusion-Weighted 3D MRI, Using Diffusion-Weighted Driven-Equilibrium (DW-DE) and Multishot Segmented 3D-SSFP Without Navigator Echoes," Magnetic Resonance in Medicine. vol. 50, 2003. p. 821-829 (Year: 2003).*

Talavage, T., et al., "Quantitative Assessment of Auditory Cortex Responses Induced by Imager Acoustic Noise," Human Brain Mapping. vol. 7, 1999. p. 79-88 (Year: 1999).*

Detre, John A., et al. "Perfusion imaging." Magnetic resonance in medicine 23.1 (1992): 37-45.

Li, Xiufeng, et al. "Theoretical and experimental evaluation of multi-band EPI for high-resolution whole brain pCASL Imaging." NeuroImage 106 (2015): 170-181.

Li, Xiufeng, et al. "Evaluation of 3D GRASE and 2D MB-EPI for Multi-delay PCASL Imaging." (2017).

Li X., Wang D., Moeller S., Wang DJ, Chappell M, Yacoub E., and Ugurbil K. "Pushing the Limits of ASL Imaging for the Lifespan Human Connectome Projects". Proc. Intl. Soc. Mag. Reson. Med. 26 (2018):2175.

Garcia, Dairon M., Guillaume Duhamel, and David C. Alsop. "Efficiency of inversion pulses for background suppressed arterial spin labeling." Magnetic Resonance in Medicine: An Official Journal of the International Society for Magnetic Resonance in Medicine 54.2 (2005): 366-372.

Alsop, David C., et al. "Recommended implementation of arterial spin-labeled perfusion MRI for clinical applications: a consensus of the ISMRM perfusion study group and the European consortium for ASL in dementia." Magnetic resonance in medicine 73.1 (2015): 102-116.

Kholmovski, Eugene G. et al., "A Generalized k-Sampling Scheme for 3D Fast Spin Echo", Journal of Magnetic Resonance Imaging 11, (2000), (pp. 549-558 10 total pages).

Lee, Haakil et al., "Diffusion Imaging with the MP-RAGE Sequence", JMRI, 1994, vol. 4, (pp. 837-842, 6 total pages).

* cited by examiner

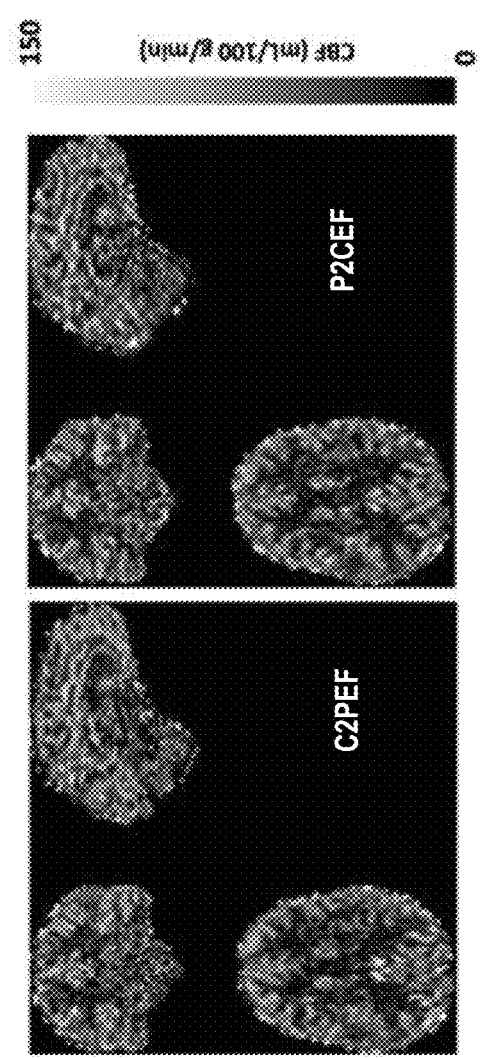
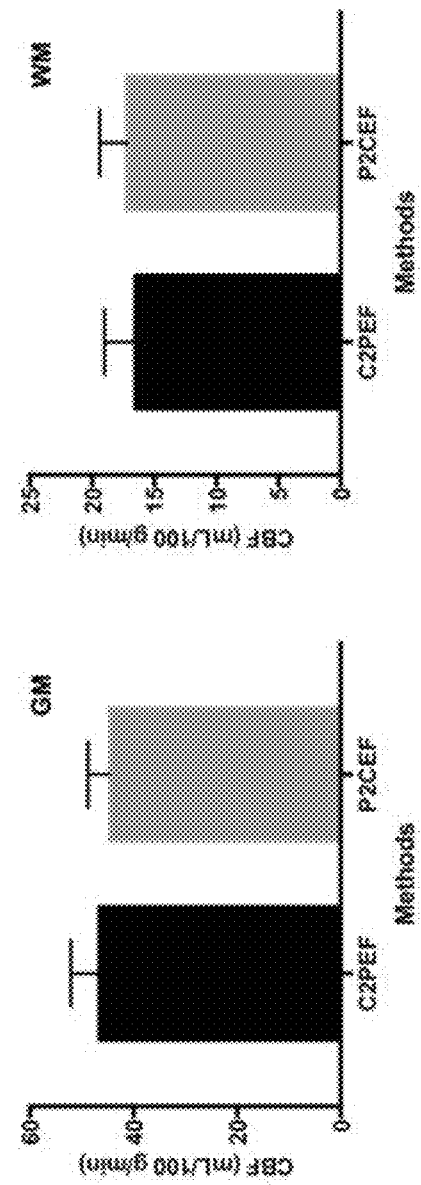
*Fig. 4A*
*Fig. 4B*

SLICE ORDERING FOR MB-EPI ASL IMAGING

CROSS-REFERENCE TO RELATED APPLICATIONS

This application claims the benefit of U.S. Provisional Application Ser. No. 62/837,784 filed Apr. 24, 2019, which is incorporated herein by reference in its entirety.

GOVERNMENT RIGHTS

This invention was made with government support under EB015894 and TR000114 awarded by the National Institutes of Health. The government has certain rights in the invention.

TECHNICAL FIELD

The present invention relates generally to slice acquisition ordering for magnetic resonance imaging (MRI) and, more particular, to slice ordering optimized for multi-band echo planar imaging (MB EPI) with pseudo-continuous arterial spin labeling (PCASL).

BACKGROUND

Arterial spin labeling (ASL) is a non-contrast enhanced perfusion imaging method performed with magnetic resonance imaging (MRI) scanners. ASL can provide quantitative measurements of cerebral blood flow (CBF) as a surrogate marker of brain metabolism and function. To improve the ability to assess subtle perfusion changes, due to either pathophysiology or development, in thin or atrophic cortical regions, as well as in small subcortical structures, high-resolution ASL imaging is highly desired to reduce partial volume effects on CBF measurements. 2D multi-band echo planar imaging (MB EPI) pseudo-continuous arterial spin labeling (PCASL) has been shown to be a viable and valuable approach for high-resolution whole brain perfusion imaging. To increase the temporal stability of the perfusion signal, background suppression (BS) of the static tissue using combined pre-saturation and inversion RF pulses has been proposed for ASL imaging. The BS can also benefit high-resolution 2D MB EPI PCASL imaging, although such a benefit will be reduced with increases in the number of slices acquired within a slice band as well as with increases in the slice acquisition time.

In ASL brain imaging using a 2D multi-slice acquisition, sequential ascending slice acquisition order is typically utilized, and in MB EPI PCASL imaging, multiple slices in each slice band are acquired sequentially from inferior to superior. However, when using a sequential ascending slice acquisition order, relative static tissue signal differences between neighboring slices across individual slice bands in MB EPI PCASL imaging with BS are dramatically larger than those in MB EPI PCASL imaging without BS, and can cause severe subtraction errors/artifacts, especially when subjects have large motion. Sometimes, such subtraction errors/artifacts cannot be corrected or removed through motion correction. To improve the robustness of MB EPI PCASL imaging with BS, relative static tissue signal differences between neighboring slices across individual slice bands need to be minimized.

SUMMARY

Embodiments of the present invention address and overcome one or more of the above shortcomings and drawbacks, by providing methods, systems, and apparatuses related to alternative slice ordering for use in MB EPI ASL imaging.

According to some embodiments, a method for generating a perfusion weighted image using ASL with segmented acquisitions includes dividing an anatomical area of interest into a plurality of slices and performing a MB EPI acquisition process using a magnetic resonance imaging MRI system to acquire a control image dataset representative of the plurality of slices using a peripheral-to-central (or central-to-peripheral) slice acquisition order. An ASL preparation process is performed using the MRI system to magnetically label protons in arterial blood water in an area upstream from the anatomical area of interest. Following a post-labeling delay time period, the MB EPI acquisition process is performed to a labeled image dataset corresponding to the slices using the peripheral-to-central (or central-to-peripheral) slice acquisition order. A perfusion weighted image of the anatomical area is generated by subtracting the labeled image dataset from the control image dataset.

Various enhancements, refinements, and other modification may be made to the aforementioned method in different embodiments of the present invention. For example, in one embodiment, the slices are numbered and an odd numbered slice is acquired first during the MB EPI acquisition process. In other embodiments, an even numbered slice is acquired first. Regardless of whether an odd or even slice is acquired first, the remaining slices may then be acquired in an ascending order, descending order, or generally any other order. In some embodiments, the MB EPI acquisition process uses combined pre-saturation and inversion RF to suppress static tissue in the anatomical area of interest from the acquired slices. In some embodiments, PCASL is used is used to magnetically label the protons.

According to another aspect of the present invention, a system for performing arterial spin labeling comprises a magnetic field generator and a central computer. The magnetic field generator comprises a plurality of coils. The central control computer configured to divide an anatomical area of interest into a plurality of slice, and use the plurality of coils to perform MB EPI acquisition process to acquire a control image dataset representative of the plurality of slices using a peripheral-to-central (or central-to-peripheral slice acquisition) order. The central control computer performs an ASL preparation process to magnetically label protons in arterial blood water in an area upstream from the anatomical area of interest. Following a post-labeling delay time period, the central computer performs the MB EPI acquisition process to a labeled image dataset corresponding to the slices using the a peripheral-to-central (or central-to-peripheral slice acquisition) order. Then, the central computer generates a perfusion weighted image of the anatomical area by subtracting the labeled image dataset from the control image dataset.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there are shown in the drawings embodiments that are presently preferred, it being understood, however, that the invention is not limited to the specific instrumentalities disclosed. Included in the drawings are the following Figures:

FIG. 4A shows cerebral blood flow (CBF) maps of one typical subject evaluated with two different slice acquisition orders described herein;

FIG. 4B shows CBF measurements from five subjects corresponding to the data presented in FIG. 4A;

DETAILED DESCRIPTION

The present invention relates generally to methods, systems, and apparatuses related to alternative slice acquisition order schemes for MB EPI PCASL imaging. The disclosed slice acquisition orders are completely different from traditional, sequential or interleaved slice acquisition strategies employed with standard ascending or descending slice acquisition approaches. Although the acquisition orders are described herein in the context of PCASL, it should be understood that the acquisition orders can generally be applied to any type of MB EPI acquisition.

Figure 1A:
FIG. 1A illustrates a series of alternative slice acquisition orders for an even number of slices, as may be used in some embodiments.
Figure 1B:
FIG. 1B illustrates a series of alternative slice acquisition orders for an odd number of slices, as may be used in some embodiments.

FIGS. 1A and 1B illustrate four slice acquisition orders for MB EPI PCASL imaging with BS, as may be used in some embodiments of the present invention. This example shows the alternative slice acquisition orders for high-resolution whole brain MB EPI PCASL imaging with a total of 60 slices and a multi-band factor 6. Image 105 show the slice bands overlaid on anatomic image. In FIG. 1A, the number of slices within the slice band is even. The columns depict the following slice orders: ascending slice acquisition order (ASC), central-to-peripheral slice acquisition order with odd slice acquired first (C2POF), central-to-peripheral slice acquisition order with even slice acquired first (C2PEF), peripheral-to-central slice acquisition order with odd slice acquired first (P2COF), and peripheral-to-central slice acquisition order with even slice acquired first (P2CEF).

In FIG. 1B, the number of slices within the slice band is odd. The columns show the following slice orders: ASC, central-to-peripheral slice acquisition order with ascending slice acquisition first (C2PAF), central-to-peripheral slice acquisition order with descending slice acquisition order first (C2PDF), peripheral-to-central slice acquisition order with ascending slice acquisition order first (P2CAF), and peripheral-to-central slice acquisition order with descending slice acquisition order first (P2CDF). As shown in FIGS. 1A and 1B, the major difference between two central-to-peripheral/peripheral-to-central methods is whether even or odd slices are acquired in an ascending order, which also determines whether neighboring slices across individual slice bands are acquired in an ascending order.

As a proof of concept of the alternative slice ordering methods described herein, MRI studies with healthy volunteers were performed on a Siemens 3T Prisma MRI scanner under an IRB approved protocol with written informed consent. The scanner's body coil was used for RF transmission and a 32-channel phased array head coil for signal reception.

After a scout localizer, a Siemens Auto-Align scan was used for automatic imaging prescription followed by T1-weighted anatomic scans. High-resolution MB EPI PCASL imaging scans with BS were performed using a single post-bolus delay and different alternative slice acquisition orders. The BS was achieved with in-plane pre-saturation and two inversion RF pulses optimized for the suppression of grey and white matter. To investigate whether alternative slice acquisition orders improve the robustness of high-resolution MB-EPI PCASL imaging with BS, imaging scans were performed with significant subject motions with maximal translation ranging from 1.5 mm to 2.0 mm and maximal rotation from 1.5 to 2.0 degree that are significantly larger than motions in regular imaging where maximal translation is typically less than 1 mm and maximal rotation less than 1 degree. To avoid potential bias in the comparisons of imaging results using different slice acquisition orders, long imaging scans were performed with different slice acquisition orders applied in an interleaved fashion. The major imaging parameters for MB EPI PCASL imaging were as follows: TR/TE=3570/19 ms; FOV=215×215 mm2; matrix size=86×86; slice thickness/gap in percentage=2.27 mm/10; partial Fourier=6/8; multi-band acceleration factor=6; labeling duration=1.5 s; post-bolus delay (PLD)=1.6 s; and number of fully relaxed $M_0$ images acquired at the end=2. A total of 60 label and control images were acquired for each type of slice acquisition order. To facilitate image distortion correction due to an inhomogeneous $B_0$ field, spin echo EPI acquisitions with readouts matching those of the PCASL acquisitions were acquired along with ones using a reversed phase encoding (PE) direction. Post-processing, such as motion correction, was performed with SPM. CBF quantification was achieved using the single-blood compartment model. Statistical analyses were performed using GraphPad Prism software.

The results of the proof of concept experiment indicate that the proposed alternative slice acquisition orders consistently improved the robustness of MB EPI PCASL imaging with BS and greatly minimized motion-associated subtraction errors/artifacts. The results from imaging scans using C2POF and P2COF slice orders were very similar to those using C2PEF and P2CEF, respectively. Therefore, only results from the C2PEF and P2CEF slice orders are presented in the results depicted herein.

Figure 2:
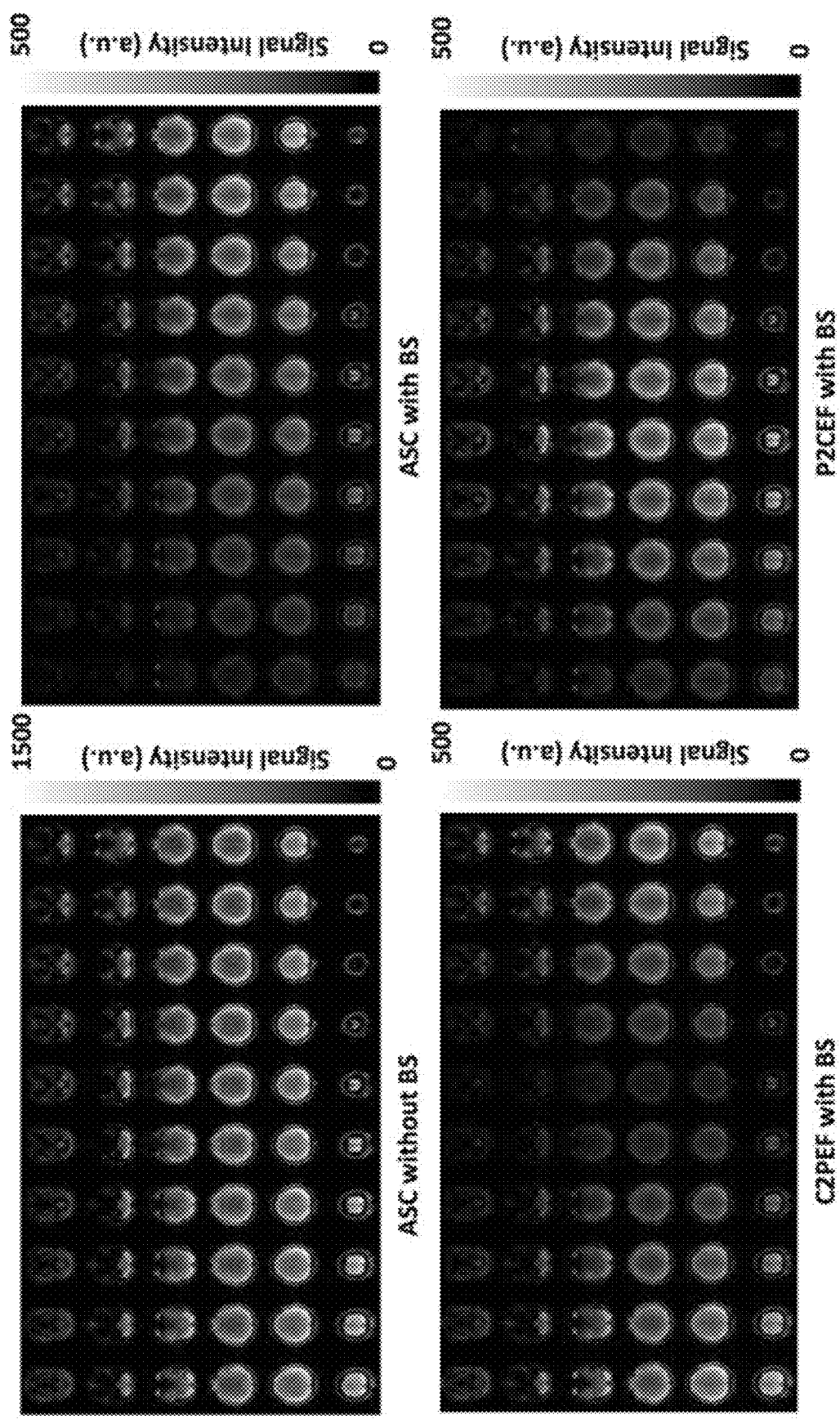
FIG. 2 shows control images from MB EPI PCASL imaging using different slice acquisition orders, as may be used in some embodiments.

FIG. 2 shows control images from MB EPI PCASL imaging using different slice acquisition orders: ASC, C2PEF and P2CEF. The reduction of static tissue signal with BS ranges from about 94% for the first acquired slices to about 65% for the last acquired slices of 6 slice bands.

Figure 3:
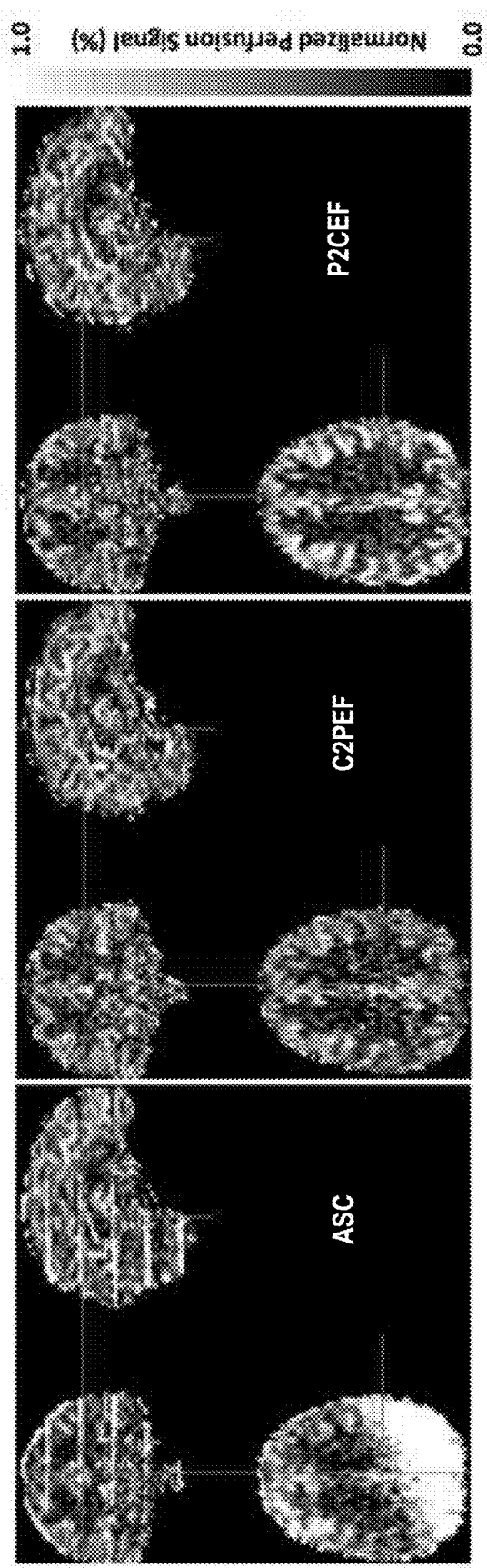
FIG. 3 shows normalized perfusion-weighted images from acquisitions using MB EPI PCASL with BS and different slice acquisition orders, as may be used in some embodiments.

FIG. 3 shows normalized perfusion-weighted images from acquisitions using MB EPI PCASL with BS and different slice acquisition orders: ASC, C2PEF and P2CEF. The perfusion-weighted images exhibit obvious artifacts within the slices at the edges of slice bands when using the ASC slice ordering.

FIGS. 4A and 4B illustrates quantitative imaging results from MB EPI PCASL with BS using different slice acquisition orders. FIG. 4A shows cerebral blood flow (CBF) maps of one typical subject, and FIG. 4B shows CBF measurements from five subjects. In FIG. 4B, error bars represent standard errors. Statistical analyses suggest that perfusion imaging using two of the alternative slice acquisition orders, C2PEF and P2CEF, provided comparable CBF estimates for both grey and white matter in the absence of artifacts observed with the standard ASC slice ordering. Because of relaxation effects with multi-slice acquisitions, the extent of static tissue suppression reduces for later acquired slices (as shown in FIG. 2). This can be alleviated with interleaved central-to-peripheral or peripheral-to-center slice ordering.

The slice acquisition orders disclosed herein provide valuable alternatives to performing 2D multiple slice acquisition for MB EPI PCASL imaging with BS. The application of these alternative slice ordering methods can reduce relative static tissue signal differences between neighboring slices across individual slice bands, decreasing sensitivity to subject motion, minimizing ASL signal subtraction errors, and therefore, improving the robustness of MB EPI PCASL imaging with BS. Although demonstrated with MB EPI PCASL imaging in the brain, the disclosed methods will also benefit perfusion imaging using other ASL approaches with different 2D multi-slice image readouts that utilize MB acceleration in other organs. It should be noted that the disclosed methods may also significantly benefit MB EPI PCASL without BS even though relative static tissue signal differences between neighboring slices across individual slice bands are quite small, which is under current investigation. The disclosed slice acquisition orders may also benefit other MB imaging acquisitions that would benefit from minimizing relative static tissue signal differences between neighboring slices across individual slice bands.

Figure 5:
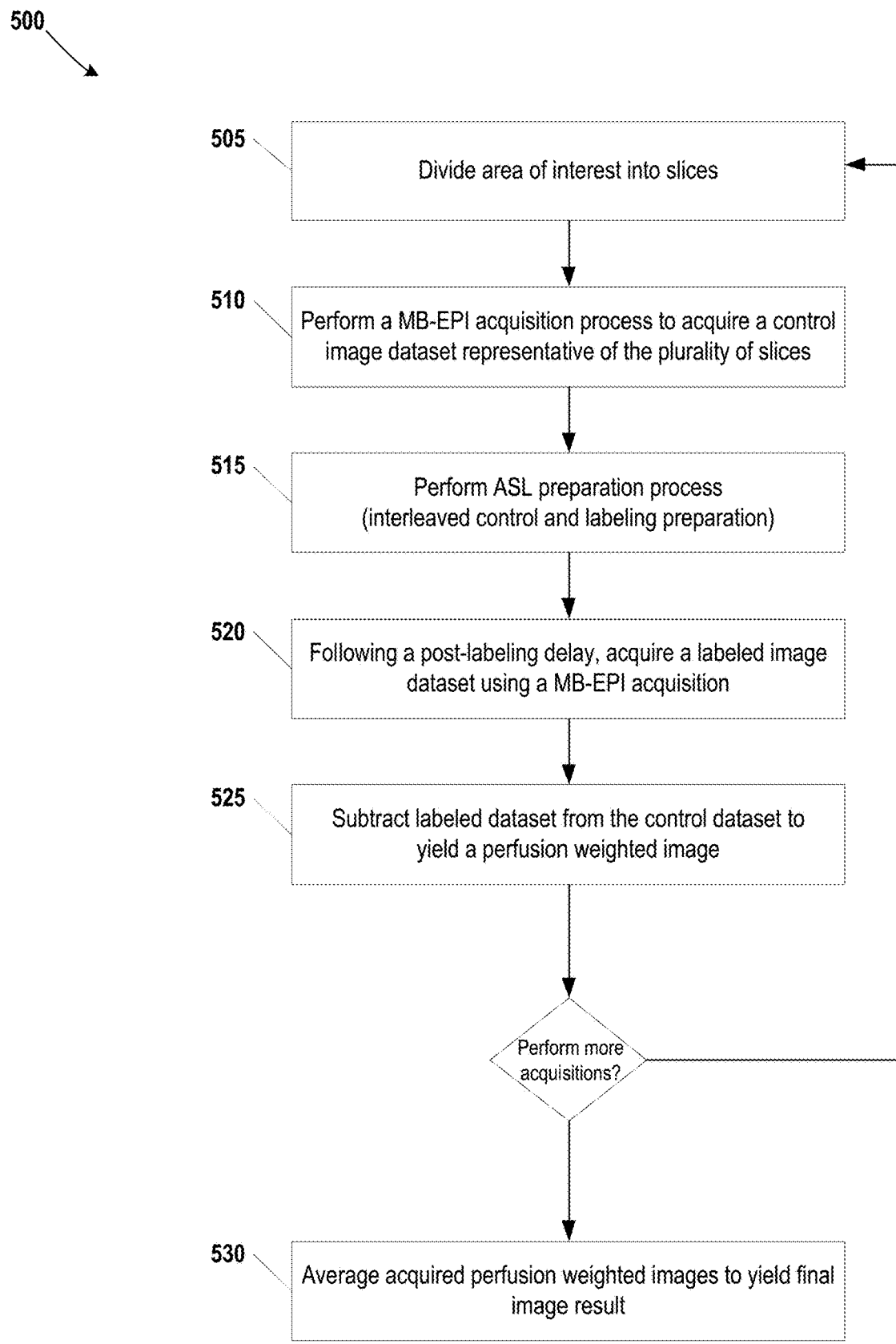
FIG. 5 provides a flow chart 500 illustrating how the techniques described herein may be used to generate a perfusion-weighted image, according to some embodiments.

FIG. 5 provides a flow chart 500 illustrating how the techniques described herein may be used to generate a perfusion-weighted image, according to some embodiments. As is understood in the art, perfusion-weighted images provide a graphical depicting of the perfusion of blood through tissue. Starting at step 505, an anatomical area of interest is divided into a plurality of slices. The exact number of slices may vary depending on the capabilities of the MRI system hardware and the particular anatomy being imaged. Next, at step 510, a MB EPI acquisition process uses an MRI system to acquire a control image dataset representative of the plurality of slices. Then, at step 515, an ASL preparation process is performed by using the MRI system to apply RF pulses to a region upstream from the area being imaged. For example, where the anatomical area of interest is the brain, the area upstream from the anatomical area of interest comprises neck vessels. The ASL preparation process provides two types of imaging preparations in an interleaved fashion: control and labeling imaging preparations. In control imaging preparation, the ASL preparation module will not label upstream arterial blood, while in labeling imaging preparation, the upstream arterial blood will be magnetically labeled.

Continuing with reference to FIG. 5, following a time delay, a labeled image dataset is acquired at 520 using a MB EPI acquisition process. In some embodiments, a central-to-peripheral slice acquisition order is utilized as described above with respect to FIG. 1. Alternatively, in other embodiments, a peripheral-to-central slice acquisition order is utilized. Depending on the embodiment, an odd number or an even numbered slice may be acquired first. Furthermore, depending on the embodiment, the slices may be acquired in an ascending order or a descending order (within the greater central-to-peripheral or peripheral-to-central ordering). Then, at step 525, the labeled image datasets are subtracted from the control image dataset to yield a perfusion-weighted image.

The difference between the labeled and control image dataset may be small. Thus, to ensure that an adequate SNR is achieved, steps 505-525 may be repeated multiple times. Then, at step 530, the perfusion-weighted images are averaged to yield a final image result. This final image result (and/or any of the intermediary perfusion weighted images) may be displayed on a graphical user interface (GUI) for presentation to a user. In some embodiments, a perfusion quantification model may then be applied to the final image to obtain a quantitative mapping of cerebral blood flow (CBF) through tissue in the anatomical area of interest. This mapping may similarly be presented in the aforementioned GUI.

Figure 6:
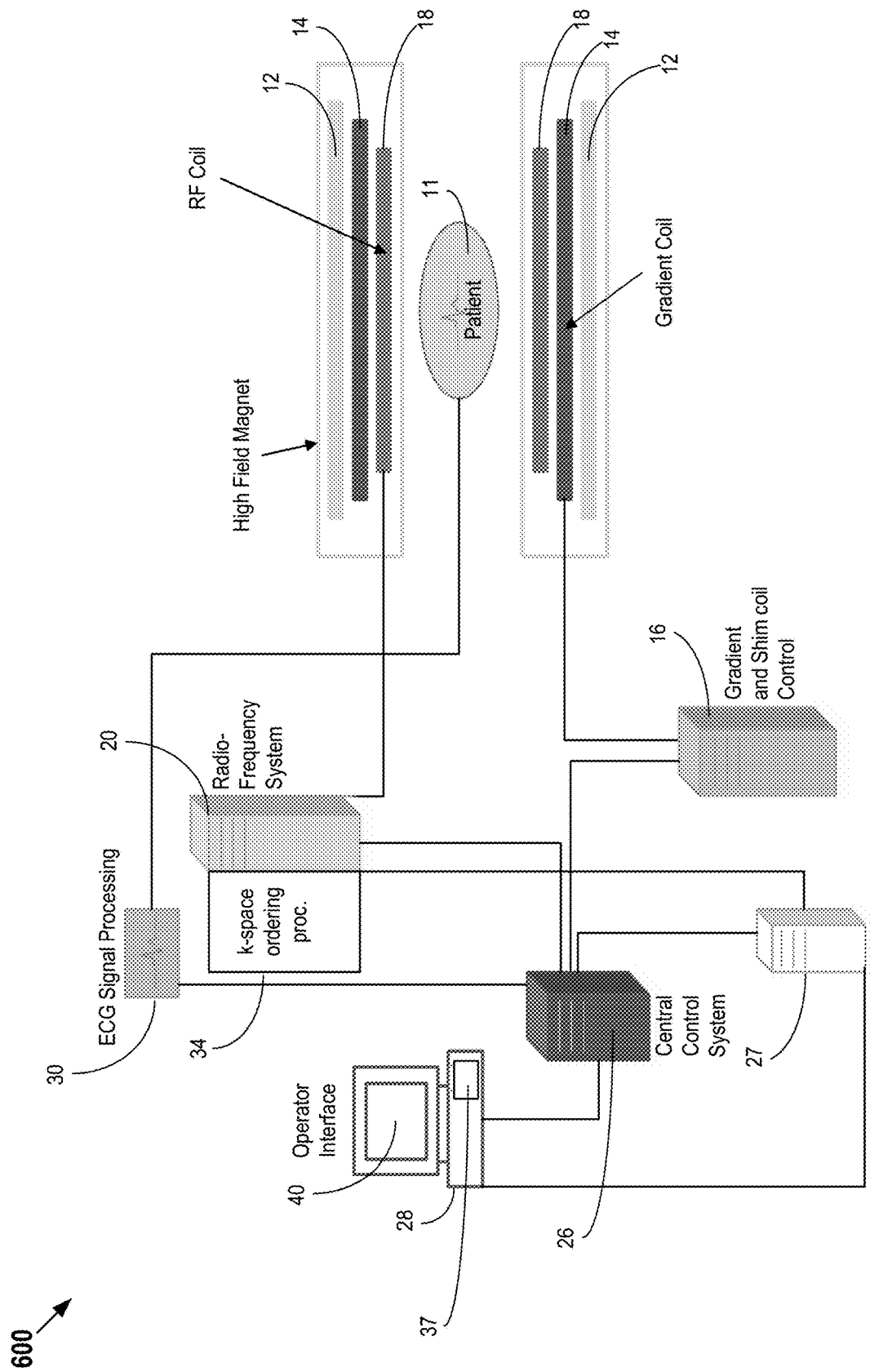
FIG. 6 shows system for ordering acquisition of frequency domain components representing MR image data for storage in a k-space storage array, as may be used in some embodiments of the present invention.

FIG. 6 shows system 600 for ordering acquisition of frequency domain components representing MR image data for storage in a k-space storage array, as may be used in some embodiments of the present invention. In system 600, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further, Radio Frequency (RF) module 20 provides RF pulse signals to RF coil 18, which in response produces magnetic field pulses which rotate the spins of the protons in the patient 11 by ninety degrees or by one hundred and eighty degrees for so-called "spin echo" imaging, or by angles less than or equal to 90 degrees for so-called "gradient echo" imaging. Pulse sequence control module 16 in conjunction with RF module 20 as directed by central control unit 26, control slice-selection, phase-encoding, readout gradient magnetic fields, radio frequency transmission, and Magnetic Resonance signal detection, to acquire Magnetic Resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide image representative data to an image data processor. In some embodiments, the image data processor is located in central control unit 26, while in other embodiments such as the one depicted in FIG. 6, the image data processor is located in a separate unit 27. Electrocardiogram (ECG) synchronization signal generator 30 provides ECG signals used for pulse sequence and imaging synchronization. A two or three dimensional k-space storage array of individual data elements in unit 34 stores corresponding individual frequency components comprising an MR dataset. The k-space array of individual data elements has a designated center and individual data elements which each have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components are sequentially acquired during acquisition of an MR dataset representing an MR image. A storage processor in unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and the magnetic field gradient change between successively acquired frequency components is substantially minimized.

Central control unit 26 uses information stored in an internal database to process the detected MR signals in a coordinated manner to generate high quality images of a selected slice (or slices) of the body and adjusts other parameters of system 600. The stored information comprises predetermined pulse sequence and magnetic field gradient and strength data as well as data indicating timing, orientation and spatial volume of gradient magnetic fields to be applied in imaging. Generated images are presented on display 40. Computer 28 includes a graphical user interface (GUI) enabling user interaction with central control unit 26 and enables user modification of Magnetic Resonance imaging signals in substantially real time. Display processor 37 processes the Magnetic Resonance signals to provide image representative data for display on display 40, for example.

A processor as used herein is a computer, processing device, logic array or other device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A display processor or generator is a known element comprising electronic circuitry or software or a combination of both for generating display images or portions thereof.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A user interface (UI), as used herein, comprises one or more display images, generated by a display processor and enabling user interaction with a processor or other device and associated data acquisition and processing functions. The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The embodiments of the present disclosure may be implemented with any combination of hardware and software components. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately. Further, the processes and applications may, in alternative embodiments, be located on one or more (e.g., distributed) processing devices on a network linking the units of FIG. 6.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. No claim element herein is to be construed under the provisions of 35 U.S.C. § 112(f), unless the element is expressly recited using the phrase "means for."

We claim:

1. A method for generating a perfusion weighted image using arterial spin labeling (ASL) with segmented acquisitions, the method comprising:

dividing an anatomical area of interest into a plurality of slice bands, each of the plurality of slice bands comprising a sub-area of the anatomical area and including a predetermined number of respective slices, each of the respective slices of a given slice band comprising a portion of the sub-area of the given slice band;

performing a multi-band (MB) echo planar imaging (EPI) acquisition process using a magnetic resonance imaging (MRI) system to acquire a control image dataset representative of the plurality of slice bands, wherein each slice band is scanned using a central-to-peripheral slice acquisition order in which one or more respective slices within the center of the slice band is scanned prior to scanning the respective slices at the periphery of the slice band;

performing an ASL preparation process, using the MRI system to magnetically label protons in arterial blood water in an area upstream from the anatomical area of interest;

following a post-labeling delay time period, performing the MB EPI acquisition process to a labeled image dataset corresponding to the slices using the central-to-peripheral slice acquisition order; and generating a perfusion weighted image of the anatomical area by subtracting the labeled image dataset from the control image dataset.

2. The method of claim 1, wherein the slices in each slice band are numbered and, for each slice band, an odd numbered slice is scanned first during the MB EPI acquisition process.

3. The method of claim 2, wherein slices of each slice band are scanned in an ascending order.

4. The method of claim 2, wherein slices of each slice band are scanned in a descending order.

5. The method of claim 1, wherein the slices in each slice band are numbered and, for each slice band, an even numbered slice is scanned first during the MB EPI acquisition process.

6. The method of claim 5, wherein slices of each slice band are scanned in an ascending order.

7. The method of claim 5, wherein slices of each slice band are scanned in a descending order.

8. The method of claim 1, wherein the MB EPI acquisition process uses combined pre-saturation and inversion RF to suppress static tissue in the anatomical area of interest from the scanned slices.

9. The method of claim 1, wherein pseudo-continuous arterial spin labeling (PCASL) is used to magnetically label the protons.

10. A system for performing arterial spin labeling, the system comprising:

a magnetic field generator comprising a plurality of coils;

a central control computer configured to use the plurality of coils to:

divide an anatomical area of interest into a plurality of slice bands, each of the plurality of slice bands comprising a sub-area of the anatomical area and including a predetermined number of respective slices, each of the respective slices of a given slice band comprising a portion of the sub-area of the given slice band;

perform a multi-band (MB) echo planar imaging (EPI) acquisition process to acquire a control image dataset representative of the plurality of slice bands, wherein each slice band is scanned using a central-to-peripheral slice acquisition order in which one or more respective slices within the center of the slice band is scanned prior to scanning the respective slices at the periphery of the slice band;

perform an ASL preparation process to magnetically label protons in arterial blood water in an area upstream from the anatomical area of interest;

following a post-labeling delay time period, perform the MB EPI acquisition process to a labeled image dataset corresponding to the slices using the central-to-peripheral slice acquisition order; and generate a perfusion weighted image of the anatomical area by subtracting the labeled image dataset from the control image dataset.

\* \* \* \* \*